United States Patent
Stacey

(10) Patent No.: US 8,604,568 B2
(45) Date of Patent: Dec. 10, 2013

(54) MULTI-CHIP PACKAGE

(75) Inventor: Simon Jonathan Stacey, Cambridgeshire (GB)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/304,968

(22) Filed: Nov. 28, 2011

(65) Prior Publication Data

US 2012/0139068 A1 Jun. 7, 2012

(51) Int. Cl.
*H01L 29/84* (2006.01)
*H01L 23/498* (2006.01)
*H01L 21/56* (2006.01)

(52) U.S. Cl.
USPC .............. 257/417; 257/737; 257/E21.502; 257/E27.068; 257/E29.324; 438/17; 438/113

(58) Field of Classification Search
USPC .......... 257/417, 737, 738, E21.502, E23.068, 257/E23.069, E29.324; 438/107, 113
See application file for complete search history.

(56) References Cited

U.S. PATENT DOCUMENTS

| | | | |
|---|---|---|---|
| 6,287,893 B1 | 9/2001 | Elenius et al. | |
| RE38,961 E | 1/2006 | Okuno et al. | |
| 8,076,184 B1 * | 12/2011 | Camacho et al. | 438/123 |
| 2009/0315170 A1 * | 12/2009 | Shim et al. | 257/692 |

* cited by examiner

*Primary Examiner* — Whitney T Moore
(74) *Attorney, Agent, or Firm* — Novak Druce Connolly Bove + Quigg LLP; Vincent M DeLuca

(57) ABSTRACT

A method for forming a stacked integrated circuit package of primary dies on a carrier die, includes forming electrically conductive pillars at connection pads defined on an active face of a carrier wafer incorporating carrier integrated circuits, the electrically conductive pillars providing electrical connections to said carrier integrated circuits; attaching primary dies to the active face of the carrier wafer, each supporting electrically conductive pillars at connection pads defined on an active face of the primary die; encapsulating the active face of the carrier wafer and the primary dies attached thereto in an insulating material; producing a wafer package by removing a thickness of the insulating layer sufficient to expose the electrically conductive pillars; and singulating the carrier wafer to form stacked integrated circuit packages, each package comprising at least one primary die on a carrier die.

29 Claims, 2 Drawing Sheets

MULTI-CHIP PACKAGE

BACKGROUND OF THE INVENTION

This invention relates to a method for forming a multi-chip integrated circuit package.

Conventional multi-chip packages require a bulky substrate to provide connections between the integrated circuits (ICs) of the package and also to provide the pins or solder elements that facilitate connection of the package to a printed circuit board (PCB). The substrate can also support any required passive components. The integrated circuits can be electrically connected to the substrate and passive components using wire bonding, flip chip attach, or solder mount techniques. Once the components of the package are in place and the electrical connections have been formed, the assembly then requires overmolding with an insulating material in order to protect the ICs, passive components and the interconnects from damage.

Such multi-chip packages have two main problems. Firstly, the size of the package formed is generally large, and secondly, the use of component-level processing in the formation of the package is generally expensive in terms of the manufacturing cost.

Several techniques have been proposed that allow the production of smaller semiconductor packages, although many are not suitable for producing multi-chip packages with which the present invention is concerned. One method that allows the formation of compact semiconductor packages is the "flip chip" technique described in U.S. Pat. No. 6,287,893, which is used to form integrated circuit chips that have contact pads bearing solder bumps for attachment to a patterned substrate. This is achieved through the use of a redistribution layer that maps connections of the integrated circuit to an array of solder bump pads. Such "flip chips" are compact and can be encapsulated to form a semiconductor package using conventional packaging techniques.

Another method that allows the formation of compact semiconductor packages is described in reissued U.S. Pat. No. RE38,961. The patent describes a method for forming contact bumps directly onto the integrated circuits of a semiconductor wafer, encapsulating the circuit-forming surface of the wafer with a sealant by screen printing and then mechanically grinding away the surface of the sealant until the upper ends of the bumps are exposed. The use of screen printing allows equipment costs to be reduced as compared with previous methods described in the art that use a mould in order to form the sealant layer.

However, these patents do not provide methods for forming multi-chip packages and do not solve the problem of requiring a bulky substrate for supporting the multiple ICs.

There is therefore a need for inexpensive method for forming chip package that comprises multiple integrated circuits.

SUMMARY OF THE INVENTION

According to a first aspect of the present invention there is provided a method for forming a stacked integrated circuit package comprising one or more primary dies supported on a carrier die, the method comprising the steps of: forming electrically conductive pillars at connection pads defined on an active face of a carrier wafer incorporating a plurality of carrier integrated circuits, the electrically conductive pillars being configured to provide electrical connections to said carrier integrated circuits; attaching a plurality of primary dies to the active face of the carrier wafer, each primary die supporting one or more electrically conductive pillars at connection pads defined on an active face of the primary die for providing electrical connections to a primary integrated circuit incorporated in the primary die; encapsulating the active face of the carrier wafer and the primary dies attached thereto in an insulating material, the thickness of the insulating material being sufficient to cover the electrically conductive pillars of the carrier wafer and the plurality of primary dies; producing a wafer package by removing a thickness of the insulating layer sufficient to expose the electrically conductive pillars; and singulating the carrier wafer so as to form a plurality of stacked integrated circuit packages, each stacked integrated circuit package comprising at least one primary die supported on a carrier die.

Suitably, the plurality of primary dies includes at least first and second primary dies, each die comprising a different integrated circuit, and the primary dies being arranged on the carrier wafer such that each stacked integrated circuit package comprises first and second primary dies.

Preferably, the electrically conductive pillars formed on the active face of the carrier wafer are arranged about the periphery of each carrier die of the wafer so as to provide at each carrier die an area free of electrically conductive pillars at which the at least one primary die can be attached.

Preferably, the step of forming electrically conductive pillars comprises electroplating copper pillars onto the carrier wafer.

Preferably, the electrically conductive pillars supported at the primary dies are formed during wafer level processing of the primary dies, prior to singulation of the primary dies.

Preferably, the relative heights of the electrically conductive pillars of the carrier dies and primary dies are selected such that, following the step of attaching the primary dies to the carrier wafer, the distal ends of the electrically conductive pillars of the carrier dies and of the primary dies are located at approximately the same perpendicular height above the carrier wafer. Preferably, prior to the step of removing a thickness of the insulating layer, the perpendicular height of the electrically conductive pillars of the carrier dies above the active surface of the carrier wafer is greater than the thickness of the at least one primary die plus the perpendicular height of the electrically conductive pillars of that primary die above the active surface of that primary die.

Preferably, the step of attaching a plurality of primary dies to the carrier wafer comprises one of: bonding the primary dies to the active face of the carrier wafer by means of an adhesive die attach film; and applying an epoxy resin between the primary dies and the carrier wafer, and curing the resin so as to bond the primary dies to the carrier wafer. Preferably, the perpendicular height of the electrically conductive pillars of the carrier dies above the active surface of the carrier wafer is greater than the thickness of the at least one primary die plus the perpendicular height of the electrically conductive pillars of that primary die above the active surface of that primary die by approximately the thickness of the die attach film or epoxy resin by which the primary dies are attached to the carrier wafer.

The method could further comprise, prior to the encapsulating step, forming a plurality of bonded wire electrical connections between connections of the primary integrated circuits incorporated in the plurality of primary dies and connections of the carrier integrated circuits incorporated in the carrier wafer.

Suitably, the connections of the primary and carrier integrated circuits are connection pads that do not support electrically conductive pillars.

Preferably, the height of the electrically conductive pillars on the primary dies is selected to be sufficiently large that the bonded wires are not exposed by the step of removing a thickness of the insulating layer.

The encapsulating step of the method could comprise one of: compression moulding the active face of the carrier wafer and the primary dies attached thereto with an epoxy resin and curing the resin so as to form an insulating epoxy polymer; and covering the active face of the carrier wafer and the primary dies attached thereto with a polymer and curing the polymer so as to form a solid insulating polymer.

The step of removing a thickness of the insulating layer could comprise one or more of mechanical grinding, chemical polishing, plasma etching, and laser ablating material from the surface of the insulating layer.

Suitably, each carrier integrated circuit comprises a network of interconnects for conducting electrical signals between connections of the at least one primary integrated circuits, the network of interconnects optionally including one or more integrated passive devices.

The method could further comprise, subsequent to the step of attaching a plurality of primary dies to the active face of the carrier wafer, attaching a secondary die to at least some of the primary dies, each secondary die supporting one or more electrically conductive pillars at connection pads defined on an active face of the secondary die for providing electrical connections to a secondary integrated circuit incorporated in the secondary die, wherein the secondary dies are arranged on the primary dies of the carrier wafer such that each stacked integrated circuit package comprises at least one secondary die. Preferably, the electrically conductive pillars supported on the active face of the said at least some of the primary dies are arranged about the periphery of the primary die so as to provide an area free of electrically conductive pillars at which a secondary die can be attached, the secondary dies having a lesser planar area that the primary dies.

The method could further comprise: prior to the step of forming electrically conductive pillars on the carrier wafer, defining a microelectromechanical system on the active surface of each carrier die; and prior to the step of attaching the plurality of primary dies to the carrier wafer, defining a cavity in at least some of the primary dies; and performing the step of attaching the plurality of primary dies to the carrier wafer in respect of those primary dies having a cavity so defined by, under a vacuum or low pressure environment, sealing those primary dies over the said microelectromechanical systems defined on the active surface of the carrier wafer such that each microelectromechanical system is free to operate within the cavity defined in its respective primary die.

The method could further comprise: prior to the step of attaching the plurality of primary dies to the carrier wafer, defining a cavity in at least some of the primary dies and then defining a microelectromechanical system within the cavity so defined; and performing the step of attaching the plurality of primary dies to the carrier wafer in respect of those primary dies having a cavity and microelectromechanical system by, under a vacuum or low pressure environment, sealing those primary dies to the active surface of the carrier wafer such that each microelectromechanical system is free to operate within the cavity defined in its respective primary die. Preferably, the step of sealing the primary dies having a defined cavity comprises bonding those primary dies to the carrier wafer by glass frit bonding or metal eutectic bonding.

Suitably, wherein each of the primary dies having a defined cavity incorporates a controller integrated circuit for the respective microelectromechanical system to be enclosed within that cavity. Preferably, the step of defining a cavity in the at least some of the primary dies is performed at the wafer level by one or more of wet etching, plasma etching, and laser ablation. Preferably, the step of defining a microelectromechanical system is performed by one or more of physical deposition, chemical deposition, lithography, diamond patterning, wet etching, and dry etching.

The method could further comprise, prior to the step of singulating the carrier wafer, processing the wafer package in accordance with one or more wafer level processing techniques, including one or both of: forming a redistribution layer so as to map said exposed electrically conductive pillars to a regular array of electrical contacts and/or form electrical connections between electrically conductive pillars of the carrier and primary dies; and forming under-bump metallisation so as to provide an array of electrically conductive mounting points suitable for receiving solder balls. Suitably, subsequent to singulation of the wafer package so as to form a plurality of stacked integrated circuit packages, each stacked integrated circuit package is suitable for flip chip connection into a circuit.

According to a second aspect of the present invention there is provided a stacked integrated circuit package comprising a primary die incorporating a primary integrated circuit bonded to the active surface of a carrier die incorporating a carrier integrated circuit, the active surface of the carrier die and the primary die bonded thereto being encapsulated in a layer of insulating material, and each of the primary and carrier dies supporting a plurality of electrically conductive pillars each extending through said layer of insulating material from an electrical connection pad of the integrated circuit of the respective die to a redistribution layer configured so as to electrically map a ball or land grid array to the electrically conductive pillars.

Suitably, the primary die includes one or more through-silicon-vias each arranged to provide an electrical connection between the integrated circuits of the primary and carrier dies.

Suitably, the face of the primary die that is bonded to the carrier die includes a cavity enclosing a microelectromechanical system. Suitably, the microelectromechanical system is defined in the active surface of the carrier die or in the cavity of the primary die. Suitably, the primary integrated circuit incorporated in the primary die is a controller for the said microelectromechanical system.

The stacked integrated circuit package could be a multi-axis accelerometer or gyroscope.

BRIEF DESCRIPTION OF THE DRAWINGS

The present invention will now be described by way of example with reference to the accompanying drawings, in which.

DETAILED DESCRIPTION OF THE INVENTION

The following description is presented to enable any person skilled in the art to make and use the invention, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

The present invention relates to a method for forming a stacked semiconductor package comprising a plurality of integrated circuits—the term "stacked" referring to the fact that the dies of the package are stacked one on top of another (at least the carrier die and one primary die). An integrated circuit is incorporated within a semiconductor die (and there may be more than one IC per die), a die being a planar element of a semiconductor wafer. It can be convenient to refer to the active face of a die, the active face being the planar surface of a die supporting the electrical contacts of the integrated circuit and at which the integrated circuit of the die is defined. The opposing planar surface of a die can therefore be termed its non-active face, which may undergo backgrinding and is typically the face by which a die is attached to a substrate. The present invention is not limited to any particular semiconductor material and may be used with, for example, silicon, germanium, and gallium arsenide.

In particular, the invention relates to a method for forming a semiconductor package by means of a wafer level process (i.e. a process that is performed on a semiconductor wafer comprising a plurality of dies prior to singulation of the dies). By extension of the term to a package comprising multiple chips, a semiconductor package formed in accordance with the methods described herein can be said to be a chip scale package (CSP). A chip scale package is normally defined as a package having an area no more than 1.2 times the area of the die contained therein—thus in the present context, a multi-chip CSP is no more than 1.2 times the area of the largest die contained therein: the carrier die.

The method of the present invention combines a carrier IC in wafer form with one or more integrated circuit dies and therefore represents a wafer level process. The carrier IC is the largest IC to be included in the package since it supports the other ICs of the package.

Figure 1:
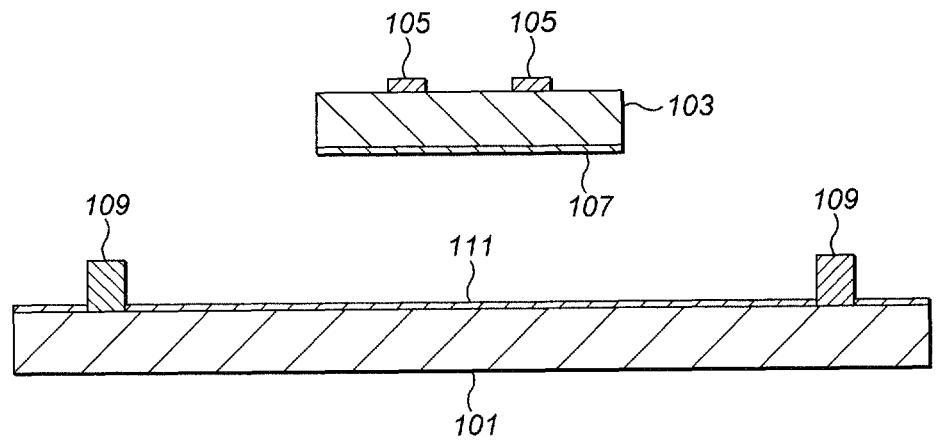
FIG. 1 is a schematic drawing of first and second integrated circuits following the formation of electrically conductive pillars.

A carrier die 101 and a primary die 103 are shown in FIG. 1. Carrier die 101 is part of a larger wafer, which for clarity is not shown in the figure. There will be more than one primary die if the end package is to comprise three or more dies in total. Each of the primary dies 103 is processed in wafer form according to the following steps prior to being combined with the carrier die:

1) Electrically conducting pillars 105 of the desired height (e.g. 10 microns) are formed at the contact pads of each primary die of the wafer on the active surface of the wafer.
2) The wafer is background (i.e. the surface of the wafer opposed to the active surface is ground away) by mechanically grinding, chemically polishing, plasma etching or laser ablation to the desired thickness (e.g. 50 microns). This is performed so as to minimise the thickness of the primary die.
3) An adhesive die attach film (DAF) is affixed to the background face of the wafer.
4) The dies of the wafer are singulated.

The processed primary die is shown in FIG. 1, bearing the electrically conductive pillars 105 and the die attach film 107. The die attach film is an adhesive layer, such as Hitachi FH 900 film. Using a die attach film has the advantage that the film is relatively thin (typically around 20 microns) in comparison to other methods of bonding the carrier and primary dies together, such as gluing the dies together using an epoxy polymer. A DAF also has no epoxy bleed or co-planarity issues that may causes problems with subsequent process steps. A DAF also allows the dies to be rapidly bonded to one another merely by applying pressure between the one or more primary dies and the carrier die. The present invention is not limited by the method selected to attach the dies together—the attachment could be by, for example, mechanical means, a liquid adhesive or a solid adhesive layer. The adhesive layer could be conductive or non-conductive.

The carrier dies are processed in wafer form. Thus, electrically conductive pillars 109 are formed on a carrier wafer for all the integrated circuits defined in the wafer. A passivation layer 111 is preferably deposited over the active surface of the carrier wafer. The passivation layer could be formed by, for example, depositing an insulating oxide on the carrier wafer. Optionally, a trench may be cut around the carrier dies (typically around 20-50 microns in depth) by a laser or mechanical saw. This can allow edge passivation and improve sealing of the active/metal/dielectric layers (as appropriate) of the carrier IC by the insulating layer that is subsequently applied to encapsulate the active surface of the carrier wafer.

Importantly, the electrically conductive pillars 109 are formed such that their height is approximately equal to the total thickness of primary die 103, electrically conductive pillars 105, die attach film 107 (or whichever adhesive layer is being used). This is with the aim of ensuring that, when the dies are in situ in the package, the distal ends of the electrically conductive pillars all extend to approximately the same perpendicular height above the surface of the carrier die. If multiple primary dies are to make up the package in a side-by-side configuration then the thickness of the thickest die should be used for calculating the required height of electrically conductive pillars 109. For example, if the thickness of the primary die is 50 microns after backgrinding, the height of the electrically conductive pillars on the primary die is 10 microns and the thickness of the die attach film is 20 microns, then the height of the electrically conductive pillars of the carrier wafer would be approximately 80 microns.

Figure 2:
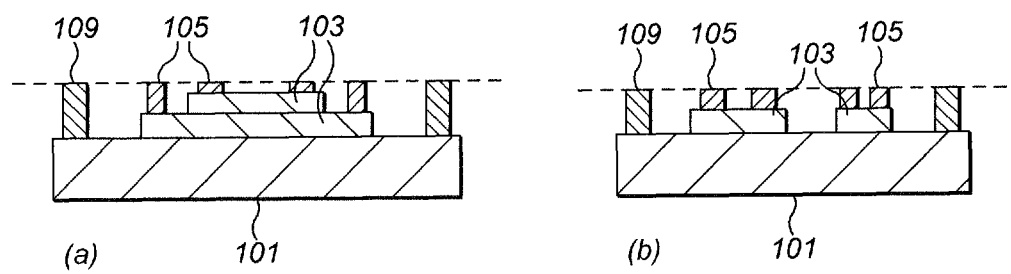
FIG. 2 is a schematic drawing of primary dies in a stacked configuration (a) and a side-by-side configuration (b)

Once the carrier wafer and primary dies have been prepared, the primary dies are attached to the carrier wafer. In the preferred embodiment, the attachment of each primary die to the carrier wafer is by means of a die attach film 107. As shown in FIG. 2, if there are multiple primary dies 103 per carrier die 101 the primary dies may be arranged in a stacked configuration (a) or a side-by-side configuration (b), or a combination of the two configurations. In a stacked configuration, primary dies 103 are stacked on top of one another in size order, with the largest die being the carrier die (lowest) and the smallest die being the uppermost die. This allows the electrically conductive pillars 105, 109 of each die to be exposed. In a side-by-side configuration, primary dies 103 are arranged side-by-side on the surface of carrier die 101 as shown in the figure. A discrepancy in the thicknesses of the primary dies 103 can be corrected for by appropriate selection of the heights of the electrically conductive pillars formed on each die. In a stacked configuration, it can be preferable to deposit a passivation layer on the active surface of the primary dies that support one or more smaller primary dies so as to ensure good electrical isolation of the integrated circuits in the package.

In a stacked configuration, the number of primary dies is generally limited by the maximum achievable height of the electrically conductive pillars 109 of the carrier wafer and the minimum thickness of the primary dies. Preferably the pillars

105, 109 are electroplated copper formed on the contact pads of the integrated circuits of the carrier and primary dies so as to provide electrical connections to those integrated circuits. Typically the contact pads will be aluminium. It is difficult to electroplate copper pillars of a height greater than 150 microns (although 200-250 microns can be achieved) and the minimum thickness to which a silicon die can be ground is around 50 microns. This limits the number of primary dies that can be stacked typically to around 2-3.

It is advantageous if, for the carrier die and any primary die supporting a smaller primary die, the electrically conductive pillars are arranged around the periphery of the dies so as to provide an area at which primary dies can be attached. This can be achieved through appropriate design of the integrated circuits of the dies so as to position the contact pads of the integrated circuits about their periphery. If this is not possible for a given die then a redistribution layer may be applied to the subject die prior to attachment of the one or more subsequent dies so as to relocate the position of the conductive pillars to provide an area free of contacts at which the subsequent dies can be attached. For example, a redistribution layer could be applied to the carrier die so as to relocate the position of the conductive pillars of the carrier die and provide an area free of contacts at which the one or more primary dies can be attached.

Figure 3:
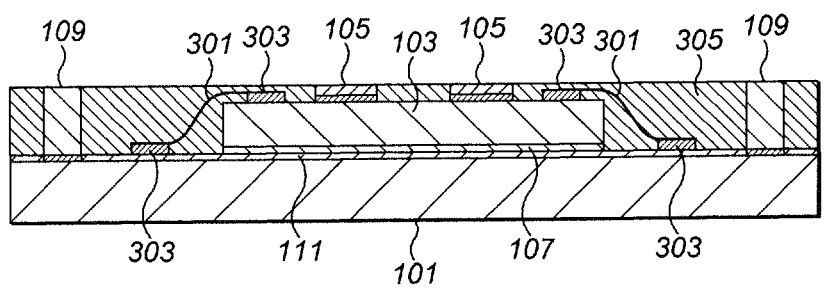
FIG. 3 is a schematic drawing of a multi-chip integrated circuit package in accordance with the present invention.

A multi-chip package formed in accordance with the present invention is shown in FIG. 3. Following attachment of primary dies 103 to carrier wafer 101, any necessary electrical connections between the integrated circuits of the carrier and primary dies are made. Such connections may be formed by wire-bonding 301 between contact pads 303 of the ICs that do not support electrically conductive pillars, as shown in the figure. If wire bond connections are to be made between particular contact pads of the ICs of the package then electrically conductive pillars are not formed at those contact pads. The electrically conductive pillars should be greater in height above the carrier wafer than the height of any wirebond loops so as to ensure that the loops are not exposed when the electrically conductive pillars are exposed.

Alternatively (and optionally), any other suitable method may be used to form connections between ICs of the package, such as use of a redistribution layer, flip-chip or solder mount techniques. Note that if flip-chip techniques are used to directly connect the active surfaces of a carrier and primary die then the primary die may not itself support any electrically conductive pillars and all connections to the IC of the primary die could be provided through the IC of the carrier die.

By providing connections between the ICs of the package, a multi-chip semiconductor package can be formed in which the ICs can operate together. This allows the functionality of a complete chipset to be provided in a single integrated circuit package. For example, a multi-chip package could include a Bluetooth controller IC, an IEEE 802.11 controller IC and a combined radio transceiver IC shared between the Bluetooth and IEEE 802.11 controller ICs. Connections between each controller IC and the radio transceiver IC would allow both ICs to use the same circuitry for radio frequency signal generation and reception, with a connection between the controller ICs allowing the controllers to negotiate for control of the transceiver circuitry.

Once any required electrical connections between ICs have been made, the active surface of the carrier wafer (i.e. the surface bearing the electrically conductive pillars and to which the primary dies are attached) and the primary dies are encapsulated in an insulating material 305 so as to protect the ICs and any interconnects. The insulating material covers the electrically conductive pillars 105, 109. Suitable materials include epoxy polymers, epoxy mould compounds, photo-definable polymers, heat-cured polymers and glasses, and may be applied by any suitable method, such as screen printing, transfer or compression moulding. It is preferable to use an epoxy polymer applied by compression moulding since this technique exhibits good coverage of uneven surfaces and forms a homogeneous protective layer that bonds well around the primary dies and electrically conductive pillars supported on the carrier wafer.

Finally, a sufficient thickness of the surface of insulating material 305 is removed so as to expose the electrically conductive pillars. The insulating material may be removed by, for example, mechanical grinding, plasma etching or laser ablation. The height of the electrically conductive pillars of the carrier wafer and the primary dies are selected such that when the dies are attached to the wafer the pillars extend to approximately the same height above the carrier wafer, and furthermore, that the pillars extend to a height that above that of any other features of the dies. This ensures that when the insulating material is removed, all of the pillars can be exposed without exposing any other electrically active features of the package. FIG. 3 shows a semiconductor package following exposure of the electrically conductive pillars.

It is not generally necessary to measure the heights of the pillars or the thickness of the dies or package during manufacture. The rate of formation of the pillars and the rate of removal of material during backgrinding of the primary dies can be determined by experimentation and hence the target height of the pillars formed on the dies and the target thickness of the primary dies can be achieved through careful control of the conditions during manufacture. Similarly, it may not be necessary to repeatedly check whether the electrically conductive pillars of the packages have been exposed during removal of the top layer of insulating material 305. A predetermined thickness of insulating material can be applied to the wafer and subsequently a predetermined thickness of the insulating material can be removed through careful control of the conditions during manufacture so as to reliably expose the pillars of each semiconductor package. Alternatively, the thickness of the package can be monitored during removal of the insulating material, with removal of material ceasing when a predetermined thickness (at which the pillars are expected to be exposed) is reached.

It is advantageous if during the removal of insulating material 305, some of the upper portions of the conductive pillars are also removed and planarised, thus correcting any non-coplanarity of the distal ends of the conductive pillars and ensuring they are exposed for all subsequent process steps.

Figure 4:
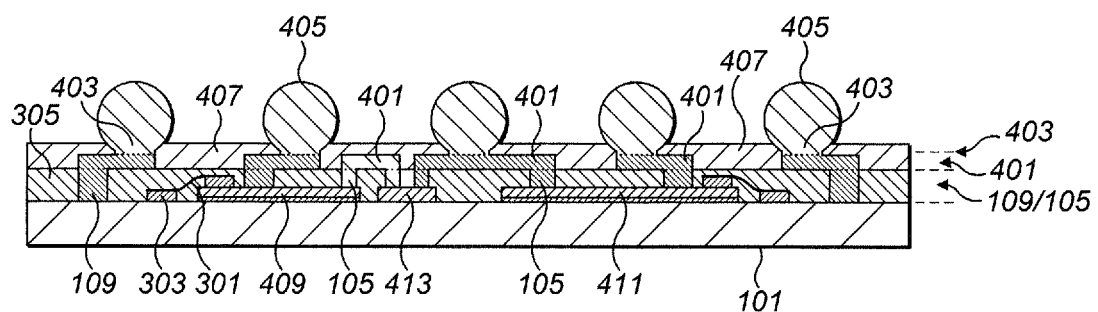
FIG. 4 is a schematic drawing of a multi-chip integrated circuit package in accordance with the present invention following the formation of a redistribution layer, under-bump metallisation and the application of solder balls.

The basic unit of a multi-chip package formed in accordance with the method of the present invention is shown in FIG. 3. Once this stage has been reached and the electrically conductive pillars have been exposed, it is generally necessary to form electrical contacts for the pillars that form an array of regular and uniform pitch. Such electrical contacts can be formed in accordance with conventional wafer level processing techniques. For example, FIG. 4 shows a multi-chip package that has been processed to include a redistribution layer (RDL) 401, an under-bump metallisation (UBM) layer 403 and solder balls 405. The redistribution layer maps the connections provided by the electrically conductive pillars onto a regular array of solder balls (a ball grid array) suitable for connection into a chip socket or for reflow attachment to an appropriately designed printed circuit board (PCB). Alternatively the process could be terminated at an earlier stage to form a land grid array (LGA). This could be after the RDL step or after the UBM step, depending on the requirements of the final package. In some cases it may be possible to arrange for the electrically conductive pillars of the dies to form a regular array, avoiding the need for a redistribution layer.

The semiconductor package shown in FIG. 4 can be formed from the basic package shown in FIG. 3 by performing the following steps:

1. Sputter depositing a TiCu seed layer.
2. Applying, patterning and curing a photo resist layer to provide redistribution layer (RDL) routing from the exposed pillars to other pillars or to solder ball positions.
3. Electroplating the patterned surface with copper to form the RDL tracks 401.
4. Stripping the photoresist mask and etch seed layer to leave the RDL tracks 401.
5. Applying, patterning and curing a polymer film 407 to provide vias down to the RDL.
6. Sputter depositing a TiCu seed layer.
7. Applying, patterning and curing a photo resist layer to define under-bump metallisation (UBM) 403.
8. Electroplating the patterned surface with copper to form the UBM features 403.
9. Stripping the photoresist mask and etch seed layer to leave the UBM features 403.
10. Print flux and attach solder balls 405 to the UBM features.

As set out in the above steps, a redistribution layer can be used to form connections between the pillars of the dies of the multi-chip package. In fact, the use of an RDL to provide IC interconnections is generally preferred over wire bonding because it is a true wafer-level process, results in a thinner structure and reduces the assembly cost. Often a mix of wire bonding and an RDL layer to provide IC interconnections is most appropriate.

A chip package formed in accordance with the present invention can be provided in a flip chip configuration. For example, a chip package that includes a UBM layer defining an array of electrical connections suitable for receiving solder bumps can be flipped subsequent to singulation and connected onto a substrate by means of solder bumps attached at the array of electrical connections defined by the UBM. The flip chip substrate could be a ceramic or laminate substrate or a silicon interposer or wafer. An RDL may or may not be required, depending on the arrangement of the electrically conductive pillars of the dies of the package.

It is particularly advantageous if the carrier die has a relatively high thermal conductivity in comparison to an equivalent undoped silicon die. This can be achieved through appropriate doping, or the inclusion of materials of high thermal conductivity, such as metallic (e.g. copper) through-silicon-vias (TSVs). A high thermal conductivity allows the carrier die to more effectively spread and dissipate heat from the ICs of the chip package.

It can be seen in FIG. 4 that the package in this example comprises two primary ICs 409 and 411, as well as a passive component 413 (such as a resistor or a capacitor). The passive component could be connected to the primary ICs and/or the carrier IC by means of wire bonding or by means of an RDL (in the figure the passive component uses a pair of electrically conductive pillars to connect to the RDL).

Large scale passive components such as 413 could alternatively be defined in the carrier IC. In some embodiments of the present invention, the carrier IC may not include any active components but may define a network of interconnects and optionally integrated passive components for one or more primary ICs. Similarly, a primary IC may not include any active components but may define a network of interconnects and optionally integrated passive components for one or more secondary ICs supported thereon. The carrier IC could provide a network of integrated passive devices (IPDs) using conventional thin film process techniques. The carrier IC may provide means for the removal of heat, for example through the use of materials having a low thermal resistance to spread or dissipate the heat generated by the primary or secondary ICs.

A primary die can include one or more electrically conductive through-silicon-vias (TSVs) in order to provide connections through the primary die to the carrier wafer at which it is supported and/or top and bottom electrical connectivity for the IC of the primary die. In particular, a TSV can be useful to provide electrical connections between a primary IC and its carrier IC without the need for wirebonding or an RDL. A TSV could be arranged to terminate in an electrically conductive pillar of the primary die so as to provide top electrical connectivity to the TSV. The use of metallic TSVs to provide electrical connections through the primary dies can also increase the thermal conductivity of the primary dies, improving the dissipation of heat from the ICs of the package. TSVs could be analogously used in secondary dies.

Once all wafer level processing has been completed, the carrier wafer—which now incorporates all of the multi-chip packages—is optionally background to the required thickness (by mechanical grinding, chemical polishing, plasma etching or laser ablation) and singulated so as to produce the ultimate multi-chip semiconductor packages comprising multiple integrated circuits.

Figure 5:
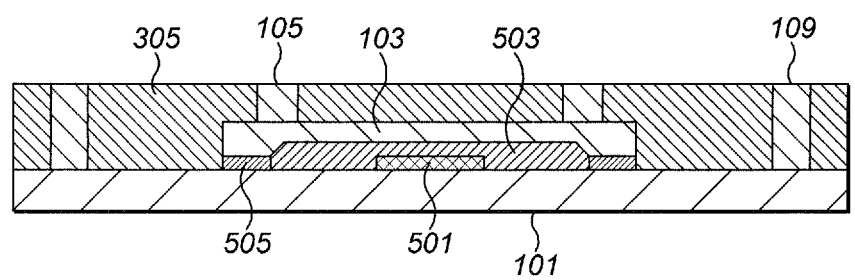
FIG. 5 is a schematic drawing of a microelectromechanical system package in accordance with the present invention.

In a particularly advantageous embodiment of the present invention that is shown in FIG. 5, the carrier die or one or more of the primary dies includes a microelectromechanical system (MEMS). In this embodiment, a primary die has a cavity etched into it, preferably into its non-active face (i.e. the face that does not include any contact pads and which is attached to the carrier wafer). Thus, either before or after forming the electrically conductive pillars on the primary die, the die has a cavity defined by wet etching, plasma etching or laser ablation. This cavity provides a space in which one or more MEMS can operate.

A MEMS 501 can be defined in the primary die in the cavity so created and/or a MEMS can be defined on the carrier die (as shown in FIG. 5) at a point that will be enclosed within the cavity of the primary die when that die is attached to the carrier wafer. The MEMS could be defined by, for example, physical or chemical deposition, lithography, and wet or dry etching. On bonding together the primary and carrier dies according to the steps of the invention a cavity 503 is formed. In this embodiment, glass frit bonding or metal eutectic bonding (indicated by sealant 505 in the figure) is preferably used to attach primary die 103 to carrier die 101 under a vacuum. These bonding techniques make a good seal between the dies and ensure that the cavity is maintained at a low pressure suitable for operation of the MEMS but other attachment techniques are possible. Once the dies are bonded together, the steps of the invention can proceed as described above, with the encapsulation of the active surface of the carrier wafer in an insulating material and subsequent wafer level processing.

The method according to the present invention is particularly suitable for the formation of accelerometer MEMS in which primary die 103 incorporates an integrated circuit controller for a MEMS 501 defined in the active surface of carrier die 101, the primary die defining a cavity 503 in which the MEMS operates.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A method for forming a stacked integrated circuit package comprising one or more primary dies supported on a carrier die, the method comprising the steps of:
   forming electrically conductive pillars at connection pads defined on an active face of a carrier wafer incorporating a plurality of carrier integrated circuits, the electrically conductive pillars being configured to provide electrical connections to said carrier integrated circuits;
   attaching a plurality of primary dies to the active face of the carrier wafer, each primary die supporting one or more electrically conductive pillars at connection pads defined on an active face of the primary die for providing electrical connections to a primary integrated circuit incorporated in the primary die, wherein the perpendicular height of the electrically conductive pillars of the carrier dies above the active surface of the carrier wafer is greater than the thickness of the at least one primary die plus the perpendicular height of the electrically conductive pillars of that primary die above the active surface of that primary die;
   encapsulating the active face of the carrier wafer and the primary dies attached thereto in an insulating material, the thickness of the insulating material being sufficient to cover at least the plurality of primary dies; and
   removing a thickness of the insulating layer sufficient to expose the electrically conductive pillars.

2. A method as claimed in claim 1, wherein the plurality of primary dies includes at least first and second primary dies, each die comprising a different integrated circuit, and the primary dies being arranged on the carrier wafer such that each stacked integrated circuit package comprises first and second primary dies.

3. A method as claimed in claim 1, wherein the electrically conductive pillars formed on the active face of the carrier wafer are arranged about the periphery of each carrier die of the wafer so as to provide at each carrier die an area free of electrically conductive pillars at which the at least one primary die can be attached.

4. A method as claimed in claim 1, wherein the step of forming electrically conductive pillars comprises electroplating copper pillars onto the carrier wafer.

5. A method as claimed in claim 1, further comprising the step of singulating the carrier wafer so as to form a plurality of stacked integrated circuit packages, each stacked integrated circuit package comprising at least one primary die supported on a carrier die, wherein the electrically conductive pillars supported at the primary dies are formed during wafer level processing of the primary dies, prior to singulation of the primary dies.

6. A method as claimed in claim 1, wherein the relative heights of the electrically conductive pillars of the carrier dies and primary dies are selected such that, following the step of attaching the primary dies to the carrier wafer, the distal ends of the electrically conductive pillars of the carrier dies and of the primary dies are located at approximately the same perpendicular height above the carrier wafer.

7. A method as claimed in claim 1, wherein the step of attaching a plurality of primary dies to the carrier wafer comprises one of:
   bonding the primary dies to the active face of the carrier wafer by means of an adhesive die attach film; and
   applying an epoxy resin between the primary dies and the carrier wafer, and curing the resin so as to bond the primary dies to the carrier wafer.

8. A method as claimed in claim 1, wherein the step of attaching a plurality of primary dies to the carrier wafer comprises one of:
   bonding the primary dies to the active face of the carrier wafer by means of an adhesive die attach film; and
   applying an epoxy resin between the primary dies and the carrier wafer, and curing the resin so as to bond the primary dies to the carrier wafer;
   wherein the perpendicular height of the electrically conductive pillars of the carrier dies above the active surface of the carrier wafer is greater than the thickness of the at least one primary die plus the perpendicular height of the electrically conductive pillars of that primary die above the active surface of that primary die by approximately the thickness of the die attach film or epoxy resin by which the primary dies are attached to the carrier wafer.

9. A method as claimed in claim 1, further comprising, prior to the encapsulating step, forming a plurality of bonded wire electrical connections between connections of the primary integrated circuits incorporated in the plurality of primary dies and connections of the carrier integrated circuits incorporated in the carrier wafer.

10. A method as claimed in claim 9, wherein the connections of the primary and carrier integrated circuits are connection pads that do not support electrically conductive pillars.

11. A method as claimed in claim 9, wherein the height of the electrically conductive pillars on the primary dies is selected to be sufficiently large that the bonded wires are not exposed by the step of removing a thickness of the insulating layer.

12. A method as claimed in claim 1, wherein the encapsulating step comprises one of:
   compression moulding the active face of the carrier wafer and the primary dies attached thereto with an epoxy resin and curing the resin so as to form an insulating epoxy polymer; and
   covering the active face of the carrier wafer and the primary dies attached thereto with a polymer and curing the polymer so as to form a solid insulating polymer.

13. A method as claimed in claim 1, wherein the step of removing a thickness of the insulating layer comprises one or more of mechanical grinding, chemical polishing, plasma etching, and laser ablating material from the surface of the insulating layer.

14. A method as claimed in claim 1, wherein each carrier integrated circuit comprises a network of interconnects for conducting electrical signals between connections of the at least one primary integrated circuits, the network of interconnects optionally including one or more integrated passive devices.

15. A method as claimed in claim 1, further comprising, subsequent to the step of attaching a plurality of primary dies to the active face of the carrier wafer, attaching a secondary die to at least some of the primary dies, each secondary die supporting one or more electrically conductive pillars at connection pads defined on an active face of the secondary die for providing electrical connections to a secondary integrated circuit incorporated in the secondary die, wherein the secondary dies are arranged on the primary dies of the carrier wafer such that each stacked integrated circuit package comprises at least one secondary die.

16. A method as claimed in claim 15, wherein the electrically conductive pillars supported on the active face of the said at least some of the primary dies are arranged about the periphery of the primary die so as to provide an area free of electrically conductive pillars at which a secondary die can be attached, the secondary dies having a lesser planar area that the primary dies.

17. A method as claimed in claim 1, further comprising:
prior to the step of forming electrically conductive pillars on the carrier wafer, defining a microelectromechanical system on the active surface of each carrier die; and
prior to the step of attaching the plurality of primary dies to the carrier wafer, defining a cavity in at least some of the primary dies; and
performing the step of attaching the plurality of primary dies to the carrier wafer in respect of those primary dies having a cavity so defined by, under a vacuum or low pressure environment, sealing those primary dies over the said microelectromechanical systems defined on the active surface of the carrier wafer such that each microelectromechanical system is free to operate within the cavity defined in its respective primary die.

18. A method as claimed in claim 17, wherein the step of sealing the primary dies having a defined cavity comprises bonding those primary dies to the carrier wafer by glass frit bonding or metal eutectic bonding.

19. A method as claimed in claim 17, wherein each of the primary dies having a defined cavity incorporates a controller integrated circuit for the respective microelectromechanical system to be enclosed within that cavity.

20. A method as claimed in claim 17, wherein the step of defining a cavity in the at least some of the primary dies is performed at the wafer level by one or more of wet etching, plasma etching, and laser ablation.

21. A method as claimed in claim 17, wherein the step of defining a microelectromechanical system is performed by one or more of physical deposition, chemical deposition, lithography, diamond patterning, wet etching, and dry etching.

22. A method as claimed in claim 1, further comprising:
prior to the step of attaching the plurality of primary dies to the carrier wafer, defining a cavity in at least some of the primary dies and then defining a microelectromechanical system within the cavity so defined; and
performing the step of attaching the plurality of primary dies to the carrier wafer in respect of those primary dies having a cavity and microelectromechanical system by, under a vacuum or low pressure environment, sealing those primary dies to the active surface of the carrier wafer such that each microelectromechanical system is free to operate within the cavity defined in its respective primary die.

23. A method as claimed in claim 1, further comprising the step of singulating the carrier wafer so as to form a plurality of stacked integrated circuit packages, each stacked integrated circuit package comprising at least one primary die supported on a carrier die, wherein prior to the step of singulating the carrier wafer, processing the wafer package is done in accordance with one or more wafer level processing techniques, including one or both of:
forming a redistribution layer so as to map said exposed electrically conductive pillars to a regular array of electrical contacts and/or form electrical connections between electrically conductive pillars of the carrier and primary dies; and
forming under-bump metallization so as to provide an array of electrically conductive mounting points suitable for receiving solder balls.

24. A method as claimed in claim 23, wherein, subsequent to singulation of the wafer package so as to form a plurality of stacked integrated circuit packages, each stacked integrated circuit package is suitable for flip chip connection into a circuit.

25. A stacked integrated circuit package comprising a primary die incorporating a primary integrated circuit bonded to the active surface of a carrier die incorporating a carrier integrated circuit, the active surface of the carrier die and the primary die bonded thereto being encapsulated in a layer of insulating material, and each of the primary and carrier dies supporting a plurality of electrically conductive pillars each extending through said layer of insulating material from an electrical connection pad of the integrated circuit of the respective die to a redistribution layer configured so as to electrically map a ball or land grid array to the electrically conductive pillars, wherein the face of the primary die that is bonded to the carrier die includes a cavity enclosing a microelectromechanical system.

26. A stacked integrated circuit package as claimed in claim 25, wherein the primary die includes one or more through-silicon-vias each arranged to provide an electrical connection between the integrated circuits of the primary and carrier dies.

27. A stacked integrated circuit package as claimed in claim 25, wherein the microelectromechanical system is defined in the active surface of the carrier die or in the cavity of the primary die.

28. A stacked integrated circuit package as claimed in claim 26, wherein the primary integrated circuit incorporated in the primary die is a controller for the said microelectromechanical system.

29. A stacked integrated circuit package as claimed in claim 25, wherein the stacked integrated circuit package is a multi-axis accelerometer or gyroscope.

* * * * *

UNITED STATES PATENT AND TRADEMARK OFFICE
CERTIFICATE OF CORRECTION

| | | |
|---|---|---|
| PATENT NO. | : 8,604,568 B2 | Page 1 of 1 |
| APPLICATION NO. | : 13/304968 | |
| DATED | : December 10, 2013 | |
| INVENTOR(S) | : Stacey | |

It is certified that error appears in the above-identified patent and that said Letters Patent is hereby corrected as shown below:

On the title page, below Item "(65) Prior Publication Data", in Column 1, insert
-- (30) Foreign Application Priority Data
Nov. 26, 2010 (GB).....................1020062 --.

In the Claims:

In Column 14, Line 48, in Claim 28, delete "claim 26," and insert -- claim 25, --, therefor.

Signed and Sealed this
Twenty-seventh Day of May, 2014

Michelle K. Lee
*Deputy Director of the United States Patent and Trademark Office*